US006161501A

United States Patent [19]

Liehr

[11] Patent Number: 6,161,501

[45] Date of Patent: Dec. 19, 2000

[54] DEVICE FOR PLASMA GENERATION

[75] Inventor: Michael Liehr, Feldatal, Germany

[73] Assignee: Leybold Systems GmbH, Hanau, Germany

[21] Appl. No.: 09/217,900

[22] Filed: Dec. 22, 1998

[30] Foreign Application Priority Data

Jan. 16, 1998 [DE] Germany ........................... 198 01 366

[51] Int. Cl.[7] ........................ C23C 16/00

[52] U.S. Cl. ........................ 118/723 MW; 156/345

[58] Field of Search ........................ 118/723 MW, 118/723 ME, 723 MR, 723 MA, 723 AN, 723 I, 723 IR; 156/345; 315/111.41

[56] References Cited

U.S. PATENT DOCUMENTS

| | | | |
|---|---|---|---|
| 3,714,605 | 1/1973 | Grace et al. | 331/107 R |
| 4,906,900 | 3/1990 | Asmussen | 315/111.81 |
| 5,527,391 | 6/1996 | Echizen et al. | 118/719 |
| 6,034,346 | 3/2000 | Yoshioka et al. | 219/121.43 |

FOREIGN PATENT DOCUMENTS

| | | |
|---|---|---|
| 0774886A1 | 5/1997 | European Pat. Off. . |
| 252916A1 | 12/1987 | Germany . |
| 4136297A1 | 5/1993 | Germany . |
| 19503205 | 7/1996 | Germany . |
| 19628949 | 1/1998 | Germany . |
| 95/26121 | 9/1995 | WIPO . |

*Primary Examiner*—Gregory Mills
*Assistant Examiner*—Luz Alejandro
*Attorney, Agent, or Firm*—Smith, Gambrell & Russell, LLP

[57] ABSTRACT

In a device for generating plasma in a vacuum chamber (9) with the aid of alternating electromagnetic fields, at least one rod-shaped conductor (7) is guided inside of a tube (16) made of insulating material through the vacuum chamber (9), the insulating tube (16) is held at its ends in one or in the opposing walls (6;17,17*a*) of the vacuum chamber (9) and is sealed off, wherein one or both ends of the rod-shaped conductor (7) are connected to a generator (18,19), wherein one or both ends of the rod-shaped conductor (7) are surrounded by outer conductors (20,21), each extending from the generator (18,19) to the respective inside wall surface (22,22*a*) of the vacuum chamber (9), wherein, in the area of the wall passages, the rod-shaped conductor (7) connected to the sources (18,19) and the outer conductors (20,21) surrounding it are each provided with a branch constituting a bypass (23,24), wherein a second rod-shaped conductor (26) extending into or through the vacuum chamber (9) surrounded by a second insulating tube (25), is connected to each of these bypasses (23,24), wherein the length of each bypass amounts to λ/2.

4 Claims, 4 Drawing Sheets

DEVICE FOR PLASMA GENERATION

INTRODUCTION AND BACKGROUND

The present invention pertains to a device for generating a plasma in a vacuum chamber with the aid of alternating electromagnetic fields, wherein a rod-shaped conductor inside a tube made of insulating material extends into the vacuum chamber and the inside diameter of the insulating tube is greater than the diameter of the conductor, wherein the insulating tube is held in the wall of the vacuum chamber at least at one end and is sealed off against its outer surface, and the conductor is connected at least at one end to the respective source for generating the alternating electromagnetic fields.

A known device for generating plasma (DE 195 03 205) makes it possible, over a limited operating range (processing area, gas pressure, microwave power) to generate plasmas for surface treatments and coating technology. The known device consists essentially of a cylindrical glass tube installed in a vacuum process chamber and a metal conductive tube located inside it, with atmospheric pressure prevailing in the interior of the glass tube. Microwave power is introduced through the walls of the vacuum process chamber at both ends through two feeds and two coaxial metal lines formed of an inner and an outer line. The missing outer conductor of the coaxial line inside the vacuum process chamber is replaced by a plasma discharge, which is ignited and maintained by microwave radiation under sufficient conditions (gas pressure), where the microwave power can escape from the two metal coaxial lines and through the glass tube into the vacuum processing chamber. The plasma surrounds the cylindrical glass tube from the outside and, together with the inner line, it forms a coaxial line with a very high attenuation per unit length. For a constant microwave power fed in from both sides, the gas pressure of the vacuum process chamber can be adjusted such that the plasma visibly burns uniformly along the device where the outer conductor of the coaxial line is missing inside the vacuum process chamber.

Also known is a device for the local generation of a plasma in a treatment chamber by means of microwave excitation (DE 41 36 297), which is subdivided by a flange that can be installed in a wall or by the wall itself into an outer and an inner part, wherein a microwave generation unit is arranged on the outer part, the microwaves of which are guided via a microwave-coupling device to the inner part, where the microwave-coupling device features an outer waveguide of insulating material leading through the flange, in which an inner conductor of metal runs, the microwaves being coupled by the microwave-generation device into the inner conductor.

The present invention proceeds from the generation of large-surface industrial plasmas heated by electromagnetic waves (in particular, microwaves) for the coating or treatment of surfaces.

In principle, plasma processes, whose plasmas are generated and maintained by high-frequency electromagnetic waves, and for which it holds that the wavelengths of the waves are approximately as large as the linear dimensions of the discharge vessels, can be divided into two classes: resonant and nonresonant systems, which both have inherent complementary advantages and disadvantages.

1. Resonant systems

Advantage: Due to the formation of standing waves, the alternating electric field experiences an increase in amplitude up to double the value of a propagating wave of equal power. This brings about, in general, the often desired increase in plasma density and electron temperature in plasmas and the associated rate increase for plasma processes. In the ideal case, this implies a doubling of the capabilities of a resonant system over and against a nonresonant one for an equal amount of electromagnetic power supplied.

Disadvantage: Undesired, temporally stable periodic fluctuations (at half the wavelength) of the local plasma uniformity are generally associated with the formation of standing waves. The tuning of the transmitter to the structure can require a not inconsiderable technical effort, particularly if the fundamental frequency or one of its first harmonics is used.

2. Nonresonant systems

Advantage: The use of a system with propagation waves does not display any periodic fluctuations of the plasma process uniformity since the formation of standing-wave fields does not occur in the ideal case. The technical effort for resonant tuning can be omitted.

Disadvantage: The field strength of the alternating electric fields, important to the efficiency of plasma processes, can generally not be increased beyond the preset value. It must be assured by optimal power absorption that no standing-wave fields can arise.

In general, there is a desire to unite the advantages of both functional principles in one technical solution while avoiding the associated disadvantages.

It is inherent to the complementary nature of the object that this problem does not have a general solution, but can be solved in some special cases. The solution sought is not in general crucial to the fundamental functioning of plasma sources that are operated with high-frequency alternating electromagnetic fields, because such plasma sources of this type are based in each case on one of the two principles. The ideal combination of both principles which is being sought does not lead to a novel technical solution but does improve, in certain cases, the utilization of the power emitted by high-friequency transmitters to the plasma source and will additionally lead to a perceptible increase in plasma densities and temperatures for large-surface applications.

The present invention pertains to plasma sources whose high-frequency line and power-transmission structure to the plasmas can be associated with the principle of transverse waves. These waves in general have negligibly small electrical or magnetic components in the wave-propagation direction and are thus approximately transverse electromagnetic waves (TEM). (The invention, however, does not pertain to waveguide structures that are based on the principle of transverse electrical or transverse magnetic waves (TE or TM).)

Planar plasma sources whose mode of functioning relies on the patent specification DE 195 03 205 or the publication unexamined specification DE 41 36 297, have already proven themselves very well in use and show properties in use which make them very recommendable for use in production facilities. The, leading waveguide structure for transmitting high-frequency power to the plasma discharge consists of a number of coaxial lines arranged in parallel, the inner conductors of which consist of electrically conductive material (metal) and the outer conductor of which consists of cylindrically shaped plasma.

Thus, an object of the present invention is to create an especially capable device of the type generally mentioned above on the basis of the two aforementioned functional principles.

SUMMARY OF THE INVENTION

The above and the other objects of the present invention can be achieved according to the invention in that the rod-shaped conductor is enclosed on its free end by an outer conductor that extends from the generator to the inner wall surface, wherein the rod-shaped conductor connected to the generator and the outer conductor enclosing it are provided with a branch forming a bypass, wherein a second rod-shaped conductor enclosed by an insulating tube extending in parallel to the first insulating tube in the chamber is connected to this bypass and wherein the length of the bypass is equivalent to λ/2.

In a preferred embodiment in which the insulating tube is held at both ends in the wall of the vacuum chamber and sealed with respect to it on its, outer surface, and the rod-shaped conductor is connected at each end to generators for producing the alternating electromagnetic fields, both ends of the rod-shaped conductor are enclosed by outer conductors and extend from the generator up to the respective inner wall surface, i.e., the rod-shaped conductor. The outer conductor enclosing it are each provided in the area of the wall passageways for the rod-shaped conductor with a branch forming a bypass, where a second rod-shaped conductor enclosed by a second insulating tube and extending through the vacuum chamber in parallel to the first insulating tube is conducted to these bypasses, the length of each bypass being equivalent to λ/2.

BRIEF DESCRIPTION OF THE DRAWINGS

The invention permits a wide variety of embodiment possibilities; some of these are schematically represented in the appended drawings wherein.

DETAILED DESCRIPTION OF THE INVENTION

The invention permits the arrangement, in an approximately parallel orientation, of at least two devices supplied with high-frequency power of equal frequency which are in a fixed phase relationship. This can be achieved in two ways: by operating each device with individual but phase-coupled high-frequency transmitters of equal frequency, or by supplying the devices from one single high-frequency transmitter whose total power is distributed to the devices in equal phase by way of a number of power dividers, the latter possibility being particularly economical. Insofar as devices according to DE 195 03 205 are concerned, the demand for fixed-phase supplying of high-frequency waves refers in each case only to one side of at least two devices (parallel) but not to bilaterally fed opposing waves (antiparallel).

Figure 1:
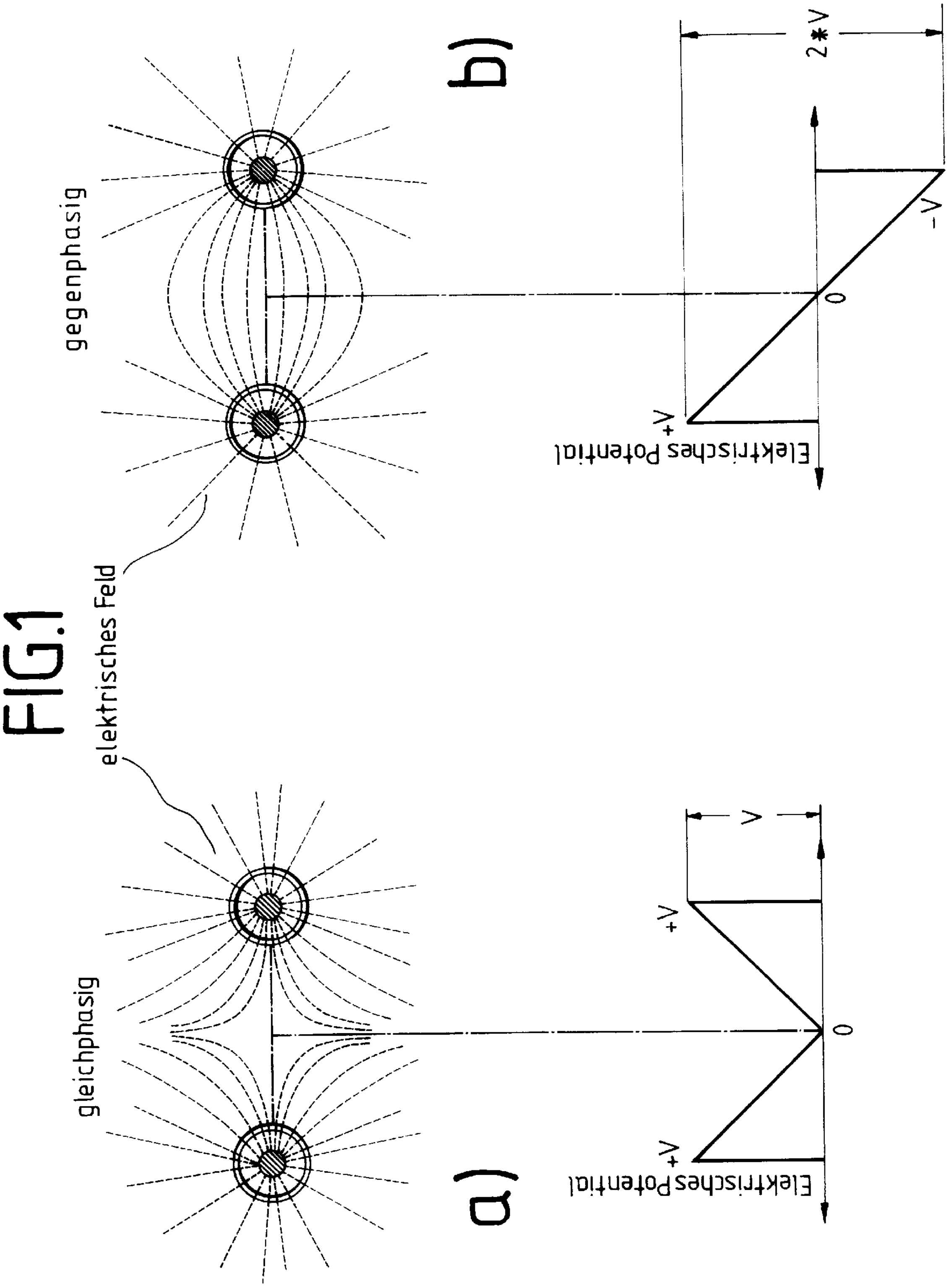
FIGS. 1*a* and 1*b* represent the electric fields of two arrangements of rod-shaped conductor pairs enclosed by insulating tubes specifically in operation in phase and at opposite phases.

If two devices arranged in parallel are supplied with fixed-phase high-frequency power of equal frequency and the phase angle is 2nπ (n=0, 1, 2, . . . ), that is, "in phase," then a distribution of the electric field of the waves in cross section as shown at a fixed point in time in FIG. 1*a* results. The greatest electric potential value is V in relation to any point inside or outside the devices. If the double device is operated, however, with fixed-phase high-frequency power of equal frequency, and if the phase angle is (2n+1)π (where n=0,1,2, . . . ), that is "opposite phase," then a distribution in the cross section of the electric field of the waves at a fixed point in time results as is shown in FIG. 1*b*. The greatest electric potential value between the conductors is 2V, that is, twice as high as in the first case. This state of affairs applies independently of whether the devices are operated with propagating or standing waves.

The increase of the electric potential is of great importance for the generation, maintenance and intensity of the plasma discharge. First, the operating gas pressure range of the plasma source can be expanded by the voltage increase and second, the necessary high-frequency power can be reduced for given operating conditions in plasma sources.

Figure 2:
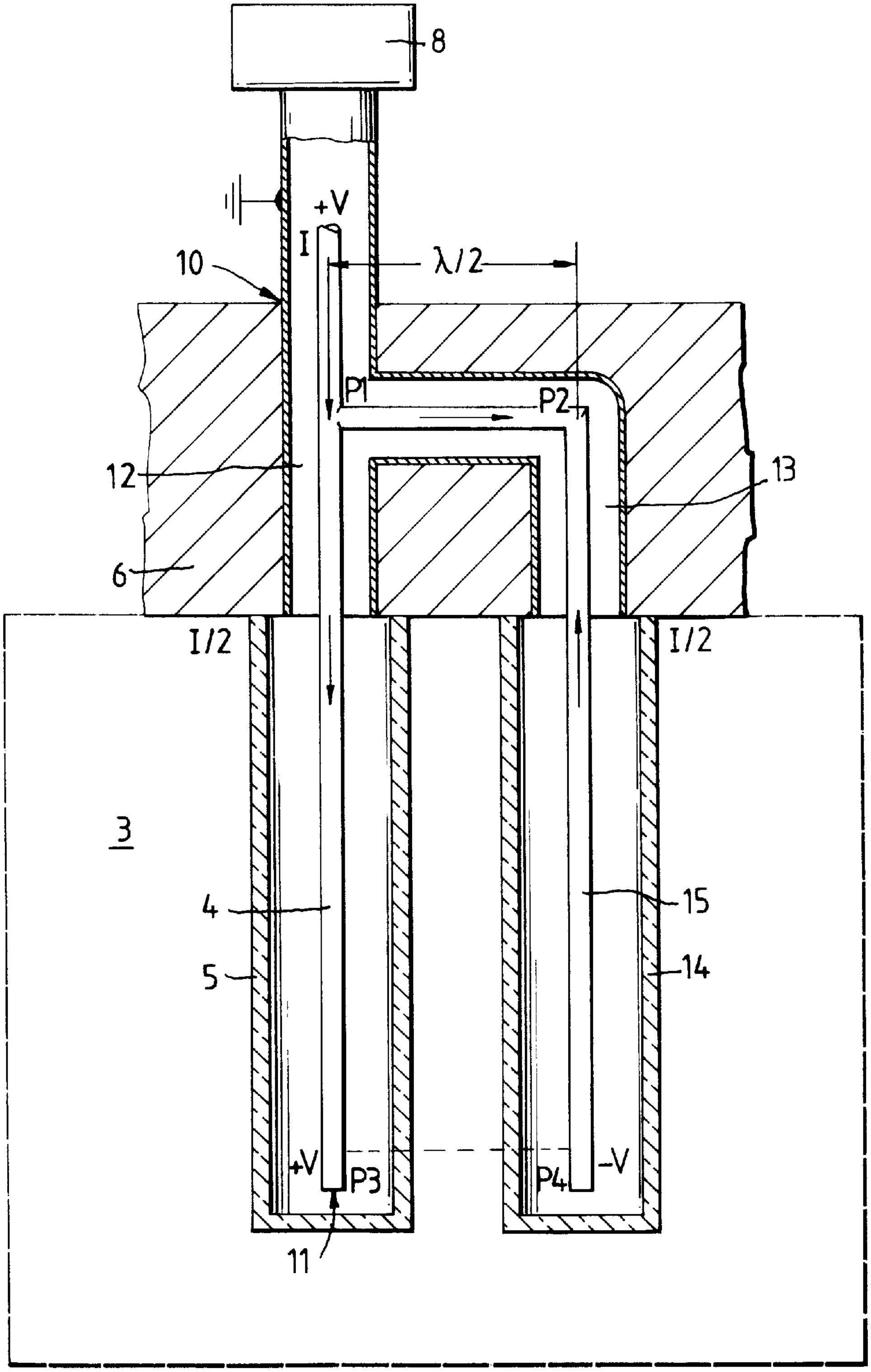
FIG. 2 is a partial sectional view of device for generating plasma in a vacuum chamber with a generator, a branch, and two rod-shaped connectors extending into the vacuum chamber with quartz tubes enclosing the latter.

In a particularly interesting embodiment of the plasma source which is composed of several devices arranged in parallel in a common row, the voltage reduction can be achieved in a way indicated in FIG. 2. The purely schematically represented device consists in this embodiment of the two insulating tubes 5, 14 projecting into the vacuum chamber 3 and fastened pressure-tight to the chamber wall 6, with the rod-shaped conductors 4, 15 extending coaxially to them, the outer conductor 12 provided between generator 8 and inner wall 6 in the form of a metal pipe or metal tubing enclosing the rod-shaped conductor 4, and the branch or bypass 13, one of whose members has the length λ/2. The basis for the voltage increase is formed by a so-called BALUN transformer in a coaxial construction. A BALUN (BALanced-UNbalanced) is a component that converts an asymmetrical line into a symmetrical one (Zinke, O., Brunswig, H.: Lehrbuch der Hochfrequenztechnik [Textbook of high-frequency technology], Vol. 1, Springer Verlag, 1973, pp. 100–111, and Johnson, Richard C.: Antenna Engineering Handbook, McGraw-Hill, 3rd edition, 1993, pp. 43–23–43–27).

The power characterized by the peak values I for current and V for voltage is supplied for each double device via the asymmetric line, a coaxial line consisting of an inner conductor and an outer conductor at ground potential and divided at a T-branch at point P, in the ratio 1:1. The maximum voltage in the asymmetric line is equal to V and the currents on the inner conductors of the double device each have the value I/2.

The essential feature of the invention in the present embodiment is the λ/2 phase shifter, that is, in the special embodiment, the coaxial line section between the points $P_1$ and $P_2$ which the waves of the one arm of the branch must pass through in comparison to the other, and which should be equal or nearly equal to half the wavelength at the design frequency. Since the phase fronts of both branch arms each start simultaneously at point $P_1$ by half the wavelength—reversed flow direction of the currents relative to one another there results in the case of the lack of the outer conductors of the branch arms, that is, direct interaction of the two inner conductors at, for instance, the points $P_3$–$P_4$ (where the connection line perpendicular to the long axis of the device), a voltage across the two conductors (+V to −V, see FIG. 1 at right) of 2V. If the waves of one arm of the branch were to experience a "delay," the waves of the arms of the branch would be in phase (+V to +V, see FIG. 1 at the right) and an increase in voltage would not be achieved.

The necessary phase shift between the two arms of the branch can also be achieved by a dielectrically loaded line in one of the arms of the branch or by other suitable measures.

Figure 3:
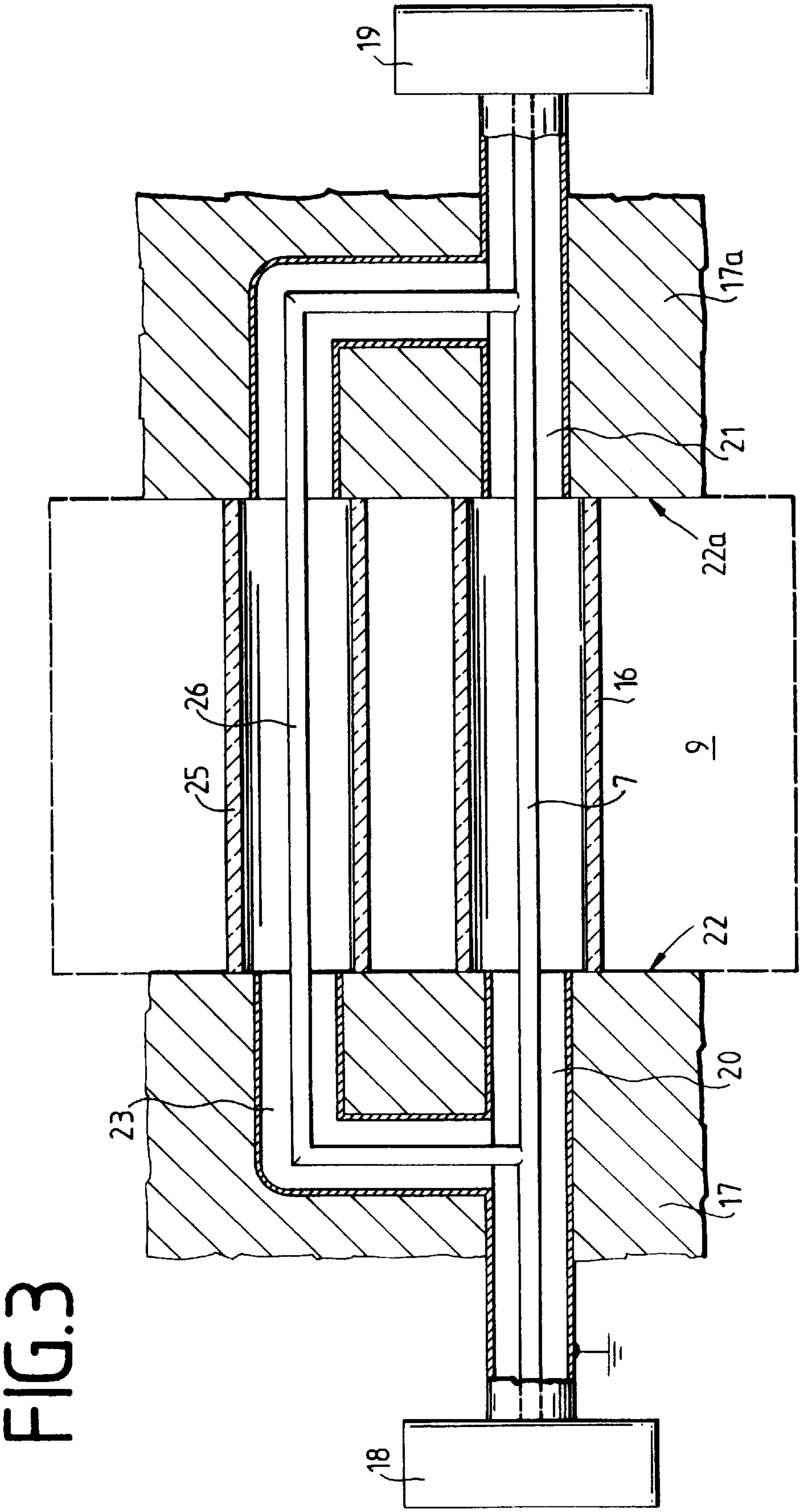
FIG. 3 is a partial sectional view of a device for generating plasma with two generators, two branches, and two conductors extending from wall to wall with quartz tubes enclosing the latter.

The embodiment represented in FIG. 3 differs from that according to FIG. 2 in that the two rod-shaped conductors 7,26 are led completely through the vacuum chamber 9, the insulating tubes 16,25 surrounding the conductors 7,26 each being connected pressure-tight at both ends to the respective opposing inner walls 22,22*a*. The rod-shaped conductor 7 is connected at both ends to generators 18,19, branches that form the necessary bypasses 23,24 to the second rod-shaped conductor 26 being provided in each case in the line section between generator 18 and 19 and the inner wall 22 and 22*a* respectively of the vacuum chamber 9. These branches are provided corresponding to the configuration represented in FIG. 2 with outer conductors 20,21, each extending from the generators 18 and 19 to the respective inner chamber wall 22 and 22*a* respectively.

Figure 4:
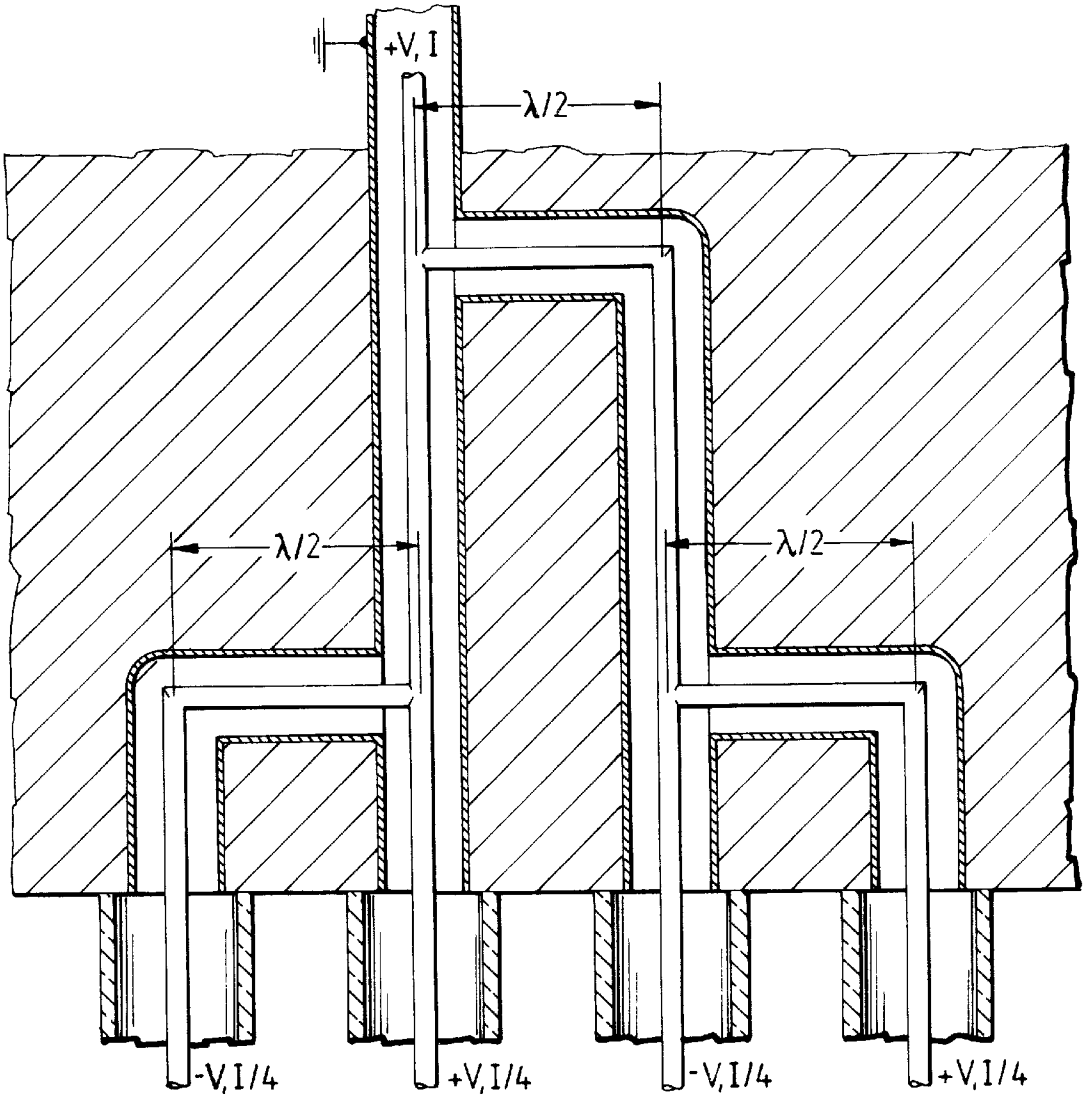
FIG. 4 is a partial sectional view of a branching unit for raising the voltage between two respective double devices.

FIG. 4 shows an embodiment in which the voltage increase between two respective double devices in an operation with four devices can be achieved with one transmitter.

If the devices are operated such that standing waves form along the devices (particularly if the wavelengths are considerably shorter than the dimensions of the plasma discharge vessel, microwaves, for instance) then the electric potential can be increased to four times the value of a multiple device operated with in-phase waves.

Further variations and modifications of the foregoing will be apparent to those skilled in the art and are intended to be encompassed by the claims appended hereto.

German priority application No. 198 01 366.3 filed Jan. 16, 1998, is relied on and incorporated herein by reference.

I claim:

1. A device for generating plasma in a vacuum chamber with the aid of alternating electromagnetic fields having a wavelength λ, comprising a vacuum chamber, a rod-shaped conductor inside of a tube made of insulating material extending into the vacuum chamber, the inside diameter of the insulating tube being greater than the diameter of the rod-shaped conductor, wherein the insulating tube is held in a wall of the vacuum chamber at one end and is sealed off against it at its outer surface, and the rod-shaped conductor is connected at least at its end facing away from the vacuum chamber to a source for generating alternating electromagnetic fields, wherein the rod-shaped conductor is surrounded in a direction towards its free end by an outer conductor that extends at least from the source to a inside wall surface of the vacuum chamber, wherein, in an area between a wall passage and the source, the rod-shaped conductor connected to the source and the outer conductor surrounding it are provided with a branch constituting a bypass, wherein a second rod-shaped conductor extending into the vacuum chamber surrounded by a second insulating tube, parallel to the first insulating tube, is connected to said bypass, wherein a length of the bypass amounts to λ/2.

2. A device for generating plasma in a vacuum chamber with the aid of alternating electromagnetic fields having a wavelength λ, comprising a vacuum chamber, a rod-shaped conductor inside a tube made of insulating material extending through the vacuum chamber, the inside diameter of the insulating tube being greater than the diameter of the rod-shaped conductor, wherein the insulating tube is held at its ends in opposing walls of the vacuum chamber and is sealed off against them at its outer surface, wherein both ends of the rod-shaped conductor are connected to a respective source for generating the alternating electromagnetic fields, wherein both ends of the rod-shaped conductor are surrounded by outer conductors, each extending from the source to respective inside wall surface of the vacuum chamber, wherein, in an area of a wall passages, the rod-shaped conductor connected to the sources and the outer conductors surrounding it are each provided with a branch constituting a bypass, wherein a second rod-shaped conductor extending through the vacuum chamber surrounded by a second insulating tube, parallel to the first insulating tube, is connected to each of these bypasses, wherein a length of each bypass is equivalent to λ/2.

3. A device for generating plasma in a vacuum chamber with the aid of alternating electromagnetic fields having a wavelength λ, comprising a vacuum chamber wherein a rod-shaped conductor inside of a tube made of insulating material extends into the vacuum chamber and the inside diameter of the insulating tube is greater than the diameter of the rod-shaped conductor, wherein the insulating tube is held in a wall of the vacuum chamber at one end and is sealed off against it at its outer surface, and the rod-shaped conductor is connected at its end facing away from the vacuum chamber to a source for generating the alternating electromagnetic fields, wherein the rod-shaped conductor is surrounded in a direction towards its free end by an outer conductor that extends at least from the source to the inside wall surface of the vacuum chamber, wherein, in the area between a wall passage and the source, the rod-shaped conductor connected to the source and the outer conductor surrounding it are provided with branches constituting bypasses, wherein additional rod-shaped conductors extending into the vacuum chamber, each surrounded by an additional insulating tube, parallel to the first insulating tube, are connected to these bypasses, wherein a length of each bypass is equivalent to λ/2.

4. A device for generating plasma in a vacuum chamber with the aid of alternating electromagnetic fields having a wavelength λ, comprising a vacuum chamber wherein a rod-shaped conductor inside of a tube made of insulating material extends through the vacuum chamber and the inside diameter of the insulating tube is greater than the diameter of the rod-shaped conductor, wherein the insulating tube is held at its ends in opposing walls of the vacuum chamber and is sealed off against them at its outer surface, wherein both ends of the rod-shaped conductor are connected to a respective source for generating the alternating electromagnetic fields, wherein both ends of the rod-shaped conductor are surrounded by outer conductors, each extending at least from the source to the respective inside wall surface of the vacuum chamber, wherein, in a area of a wall passages, the rod-shaped conductors connected to the sources and the outer conductors surrounding them are each provided with branches constituting bypasses, wherein additional rod-shaped conductors extending through the vacuum chamber surrounded by additional insulating tubes, parallel to the first insulating tube, are connected to each of these bypasses, wherein a length of each bypass is equivalent to λ/2.

* * * * *